United States Patent [19]

Ueno

[11] Patent Number: 5,151,913
[45] Date of Patent: Sep. 29, 1992

[54] SEMICONDUCTOR LASER
[75] Inventor: Yoshiyasu Ueno, Tokyo, Japan
[73] Assignee: NEC Corporation, Tokyo, Japan
[21] Appl. No.: 638,921
[22] Filed: Jan. 9, 1991
[30] Foreign Application Priority Data
    Jan. 9, 1990 [JP] Japan .................. 2-3091
[51] Int. Cl.$^5$ .................................. H01S 3/19
[52] U.S. Cl. ................................ 372/46; 372/45
[58] Field of Search ............................ 372/45, 46

[56] References Cited
U.S. PATENT DOCUMENTS
4,594,603 6/1986 Holonyak, Jr. ................ 372/46
4,644,553 2/1987 Van Ruyven et al. .......... 372/46

FOREIGN PATENT DOCUMENTS
0003176 1/1985 Japan ........................... 372/46
0296783 12/1986 Japan ........................... 372/46

Primary Examiner—Georgia Y. Epps
Attorney, Agent, or Firm—Sughrue, Mion, Zinn, Macpeak & Seas

[57] ABSTRACT

A semiconductor laser has a super-lattice active layer to which a high density impurity as equal to or over $1 \times 10^{17}$ cm$^{-3}$ is selectively diffused in the vicinity of a facet of the semiconductor laser, so that a high power output is realized. The active layer in the impurity diffusion region is formed in a three-layer structure comprising first, second and third semiconductor layers. The second semiconductor layer has an opposite type of conductivity as the first and third semiconductor layer, and is sandwiched thereby. In such a structure, a depletion layer is generated around the active layer, so that injection of current into the active layer is prevented. The blocking layer also protects the active layer from the strain stress during a process of attaching the semiconductor laser to a heatsink. In the fabricating process, a dielectric is temporarily formed to be used as a mask in a selective diffusion and in a selective growth, so that it is not necessary to align a selective growth mask and an impurity diffusion region. An impurity selective diffusion into the multi-layer epitaxial layers having GaAs layer or AlGaAs layer as a surface layer is carried out using As compound as an impurity source, so that the crystal quality of the surface layer is hard to decrease.

4 Claims, 4 Drawing Sheets

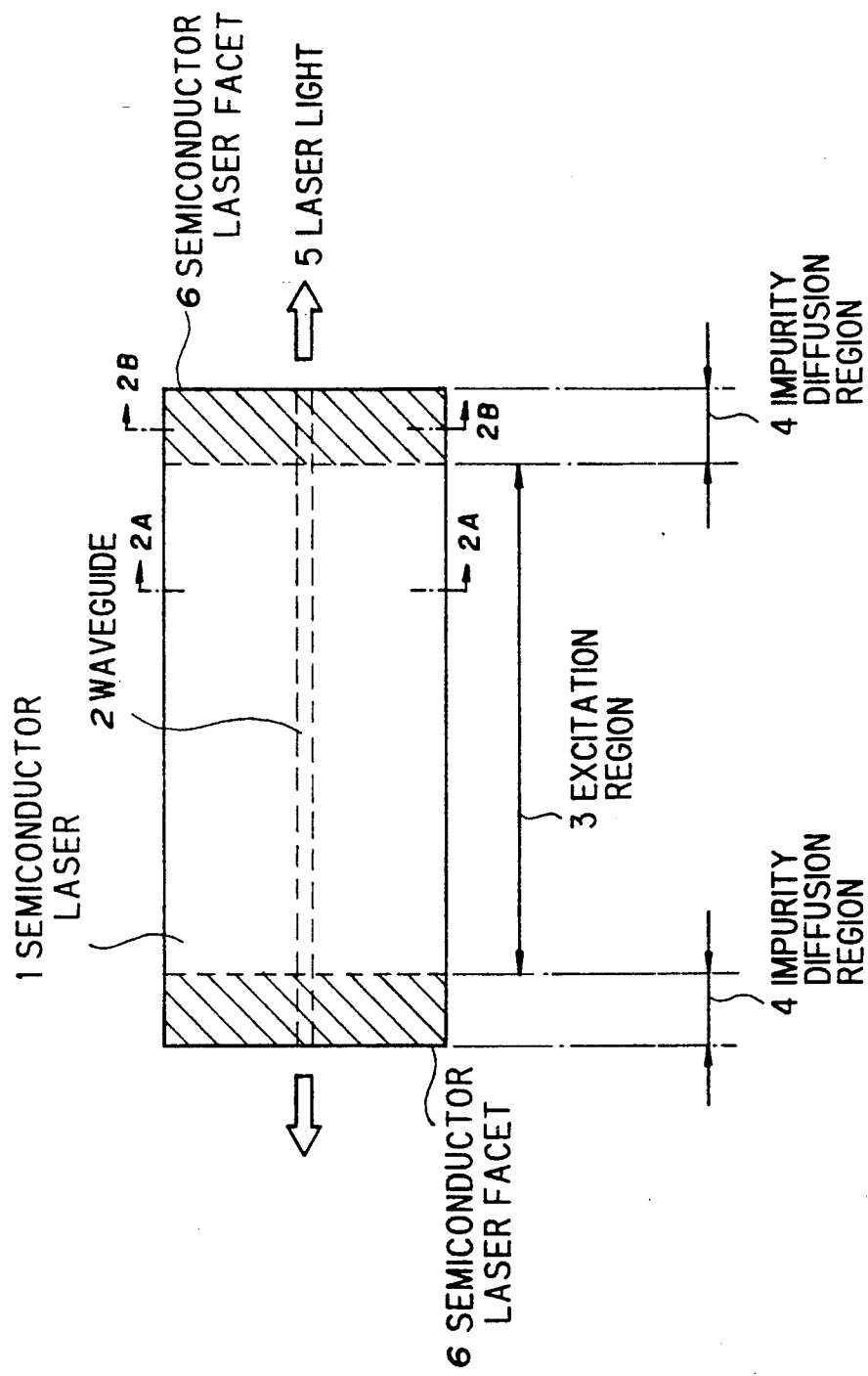

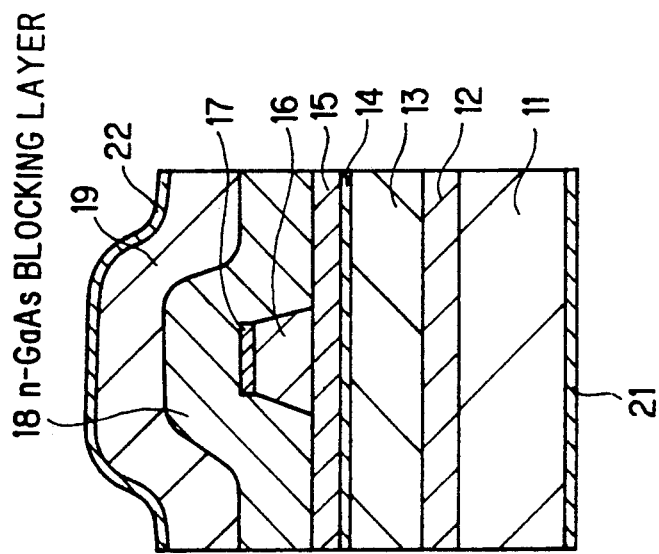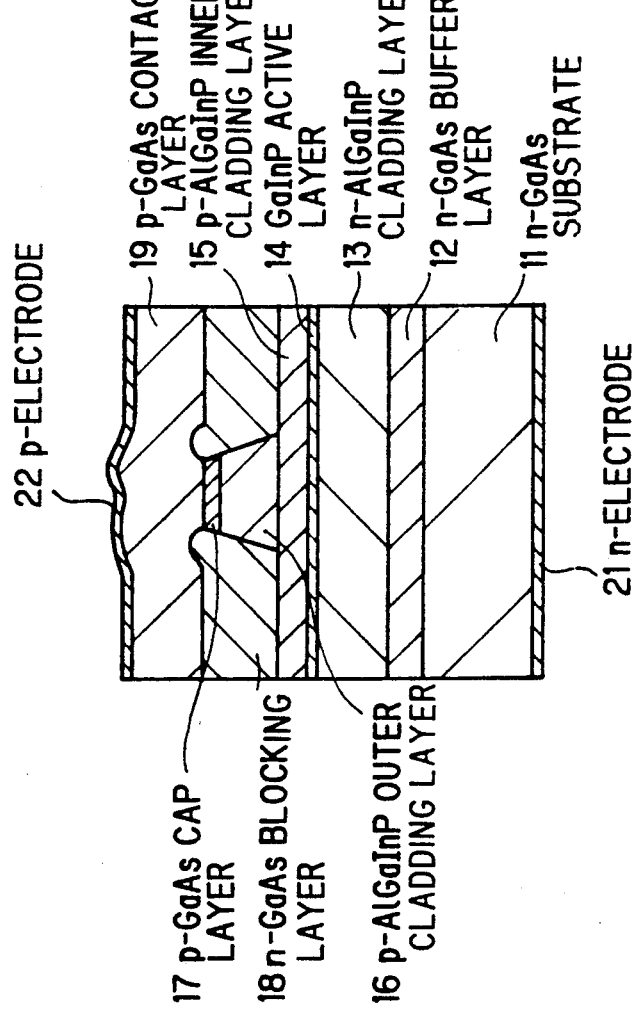

SEMICONDUCTOR LASER

FIELD OF THE INVENTION

This invention relates to a semiconductor laser and a process for fabricating the same, and more particularly, to a high power output semiconductor laser used in optical communication and a process for fabricating the same.

BACKGROUND OF THE INVENTION

In recent years, there has been a strong demand for a high power output semiconductor laser for a light source used in devices of information processing such as an optical disk memory device. However, there is an obstacle for realizing a high power output in the semiconductor laser, namely Catastrophic Optical Damage (defined as "COD" hereinafter) which occurs at a facet of the semiconductor laser. COD occurs when the semiconductor laser facet is heated and damaged partially by absorbing the laser light at the facet.

A first conventional semiconductor laser is described on pages 383 to 384, Electronics Letters, 1984, vol. 20. The first conventional semiconductor laser has a multi-quantum well (defined as "MQW" hereinafter) active layer. MQW is also called as "artificial super-lattices". In the semiconductor laser, MQW of the active layer in the vicinity of the semiconductor laser facet is disordered by selectively diffused impurity, so that the bandgap energy of MQW of the active layer in the vicinity of the facet is larger than that in the inner part of the laser resonator of the semiconductor laser. As a result, the semiconductor laser facet becomes hard to absorb the laser light, so that COD is reduced in the semiconductor laser. The disorder of MQW is described on pages 776 to 778, Applied Physics Letters, 1981, vol. 38. In the semiconductor laser, some part of a p-type cladding layer and an electrode of the semiconductor laser is removed in order to prevent an injection of currents into the active layer, for the reason that there are many defects of the crystal lattice of the active layer in the vicinity of the facet because of the high density impurity diffusion, so that the injection of current may cause destruction of the active layer.

A second conventional semiconductor laser is described in Japanese Patent Publication No. 64-14986. The second conventional semiconductor laser has a natural super-lattice active layer. The natural super-lattices are disordered by selective impurity diffusion in the vicinities of both facets of the semiconductor laser, so that the bandgap energy becomes large in comparison with that of the natural super-lattices before being disordered. It is known that the natural super-lattices are formed in the growth of GaInP or AlGaInP by Metalorganic Vapor Phase Epitaxy method (defined as "MOVPE method" hereinafter), and that Al (or Ga) and In atoms are in a row mutually in a direction of (1 1 1) in the natural super-lattices. The formation of the super-lattices is thought to be caused by differences of bonding lengths of Al-P, Ga-P and In-P in AlGaInP, for instance. It is described on pages L1549 to L1552, Japanese Journal of Applied Physics, 1988, vol. 27 that the natural super-lattices are disordered by impurity diffusion in order to increase the bandgap energy, as like in the case of MQW.

According to the first and second conventional semiconductor lasers, however, there is a disadvantage in that there are many defects of the crystal lattice of the active layer in the vicinity of the facet because of the high density impurity diffusion, so that the injection of current may cause destruction of the active layer. In the first conventional semiconductor laser, some part of a p-type cladding layer and an electrode of the semiconductor laser is removed to prevent the injection of current into the active layer, however, there is another disadvantage in that the active layer of the semiconductor laser may be suffered by the strain stress during the process of attaching the semiconductor laser to a heat-sink because of lack of the cladding layer as a protection layer, so that the reliability of the semiconductor laser may reduce.

SUMMARY OF THE INVENTION

Accordingly, it is an object of the invention to provide a semiconductor laser having a high power output without injection of current into an active layer in the vicinities of both facets of the semiconductor laser.

It is a further object of the invention to provide a process for fabricating a semiconductor laser without causing any damage to an active layer thereof during the fabrication process.

According to a first feature of the invention, a semiconductor laser comprises:

a first cladding layer formed on the substrate, the first cladding layer having the same type of conductivity as the substrate,;

a super-lattice active layer formed on the first cladding layer, the active layer in the vicinity of laser facets of the semiconductor laser having the impurity density of equal to or over $1 \times 10^{17}$ cm$^{-3}$;

a second cladding layer formed on the active layer, the second cladding layer having the opposite type of conductivity as the first cladding layer, and the second cladding layer with the first cladding layer and the active layer forming a double-hetero structure; and a blocking layer formed on the second cladding layer in the high density impurity region, the blocking layer having the same type of conductivity as the first cladding layer.

According to a second feature of the invention, a method for fabricating a semiconductor laser comprises:

forming a first cladding layer on a semiconductor substrate, the first cladding layer and the substrate having the same type of conductivity;

forming a super-lattice active layer on the first cladding layer;

forming a second cladding layer on the active layer, the second cladding layer having the opposite type of conductivity as the first cladding layer;

forming a high density impurity diffusion region selectively in the active layer, the impurity density in the active layer being equal to or over $1 \times 10^{17}$ cm$^{-3}$, the region having a surface layer selected from GaAs and AlGaAs; and forming a blocking layer on the second cladding layer in the high density impurity diffusion region, the blocking layer having the same type of conductivity as the first cladding layer.

BRIEF DESCRIPTION OF THE DRAWINGS

The invention will be explained in more detail in conjunction with appended drawings wherein:

FIG. 1 is a plan view illustrating a semiconductor laser in a preferred embodiment according to the invention;

FIGS. 2A and 2B are cross-sectional views taken on lines A—A and B—B of FIG. 1, respectively.

DESCRIPTION OF THE PREFERRED EMBODIMENTS

Figure 3A:
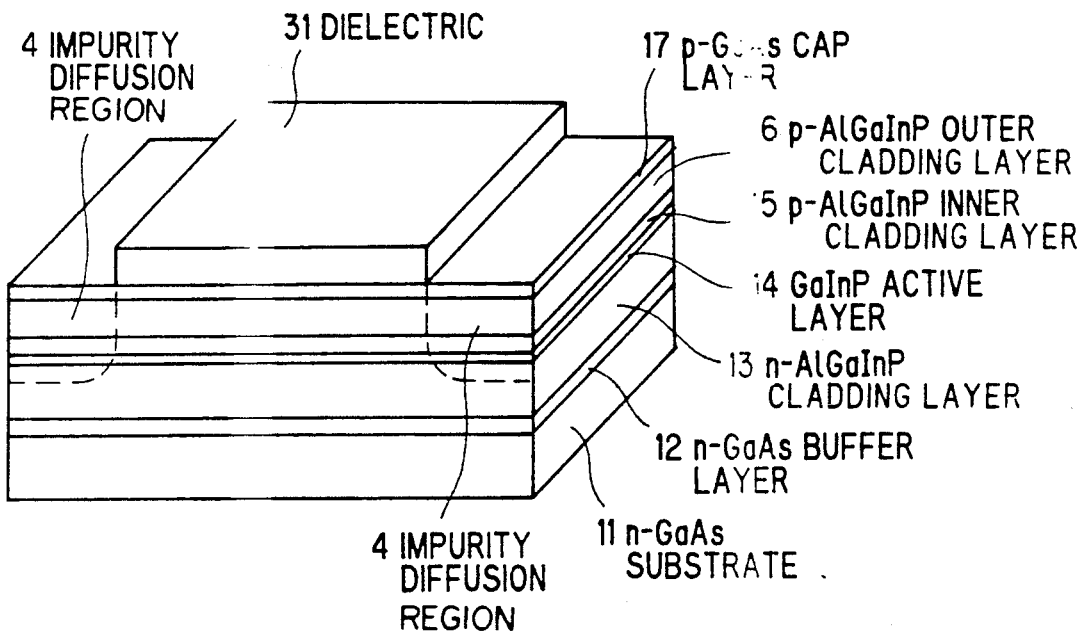
FIGS. 3A to 3D are perspective views respectively illustrating a semiconductor laser in various stages of a fabrication process in the preferred embodiment according to the invention.

FIG. 1 is a plan view illustrating a semiconductor laser in a preferred embodiment, and FIGS. 2A and 2B are cross-sectional views taken on lines A—A and B—B of FIG. 1, respectively.

The semiconductor laser comprises an n-type GaAs substrate 11, an n-type GaAs buffer layer 12, an n-type AlGaInP cladding layer 13, a GaInP superlattice active layer 14, a p-type AlGaInP inner cladding layer 15, a p-type AlGaInP outer cladding layer 16 which is selectively formed on the inner cladding layer 15, a p-type GaAs cap layer 17 which is formed on a top surface of the outer cladding layer 16, an n-type GaAs blocking layer 18 which is formed on both sides of the outer cladding layer 16 at an excitation region 3 of the semiconductor laser 1 and on whole region at both impurity diffusion regions 4 and 4 covering a top surface of the cap layer 17, a p-type GaAs contact layer 19, an n-electrode 21 covering a bottom surface of the substrate 11, and a p-electrode 22 covering a top surface of the contact layer 19.

The impurity diffusion region 4 is formed in the vicinity of the semiconductor laser facet 6 including the active layer 14 so that the impurity density of the active layer 14 in the vicinity of the semiconductor laser facet 6 is equal to or over $1 \times 10^{17}$ cm$^{-3}$. Such a high density of the impurity makes the active layer 14 disorder, so that the bandgap energy of the active layer 14 becomes large.

In the impurity diffusion region 4, the active layer is located in the three layer structure of an n-type semiconductor layer corresponding to the cladding layer 13, a p-type semiconductor layer corresponding to the inner and outer cladding layers 15 and 16 and an n-type semiconductor layer corresponding to the blocking layer 18, so that a depletion layer is generated in an n-p interface to prevent an injection of current into the active layer 14.

Next, the process of fabricating the semiconductor laser in the preferred embodiment will be explained in accordance with FIGS. 3A to 3D.

First, as shown in FIG. 3A, an n-type GaAs substrate 11 is provided, then an n-type GaAs buffer layer 12 having a thickness of 0.3 μm, an n-type AlGaInP cladding layer 13 having a thickness of 1.0 μm, a GaInP active layer 14 having a thickness of 0.06 μm, a p-type AlGaInP inner cladding layer 15 having a thickness of 0.30 μm, a p-type GaInP etching-stopping layer (not shown in FIG. 3A) having a thickness of 5 nm, a p-type AlGaInP outer cladding layer 16 having a thickness of 0.9 μm, a p-type GaInP heterobuffer layer (not shown in FIG. 3A) having a thickness of 10 nm, and a p-type GaAs cap layer 17 having a thickness of 0.3 μm are successively formed on the substrate 11.

In this embodiment, these layers mentioned above are formed by MOVPE method, however, these layers can be also formed by MBE method, Gas Source MBE method, CBE method, etc . . . The materials which are used for growing the layers are trimethylaluminum (TMA), triethylgallium (TEG), trimethylindium (TMI), dimethylzinc (DMZ), phosphine (PH$_3$), arsine (AsH$_3$), and disilane (Si$_2$H$_6$). The growth temperature is 660° C., the growth speed is 1.8 μm/hr, and the supplying ratio of V group material/III group material (V/III ratio) is 150.

The cap layer 17 becomes a surface layer when the impurity diffusions are carried out. Carriers injected into the active layer 14 recombine therein and give a gain necessary for laser oscillation. The laser light is kept in the active layer 14, the cladding layer 13, the inner cladding layer 15 and the outer cladding layer 16 which surround the active layer 14.

The composition of the active layer 14 and the etching-stopping layer is Ga$_{0.5}$In$_{0.5}$P (whose bandgap energy Eg is 1.85 eV) in the preferred embodiment, however, the material having the composition of (Al$_x$Ga$_{1-x}$)$_{0.5}$In$_{0.5}$P ($0.4 < x \leq 0.20$) may be used. In the active layer 14 having a composition of GaInP (or AlGaInP), a natural super-lattice structure is formed. The composition of the AlGaInP cladding layers is preferably (Al$_x$Ga$_{1-x}$)$_{0.5}$In$_{0.5}$P ($0.4 < x \leq 1.0$), though $x = 0.6$ (Eg = 2.27 eV) in this embodiment. The heterobuffer layer is provided to reduce discontinuous change of the band generated in a hetero interface between the GaAs layer and the AlGaInP layer.

Next, a dielectric layer 31 is formed by evaporation on the cap layer 17, and then the patterning of the dielectric layer 31 is carried out to have a striped shape by photolithography method. After that, Zn is diffused as impurity into the vicinity of the semiconductor laser facet 6 by enclosed tube diffusion method to form an impurity diffusion region 4 shown as a dashed line in FIG. 3A. The impurity source of the Zn diffusion is preferably ZnAs$_2$ and Zn$_3$As$_2$, etc., though ZnAs$_2$ is used as the impurity source in this embodiment. The high density Zn is injected into the active layer 14 within the impurity diffusion region 4, so that the bandgap energy Eg increases.

Figure 3B:
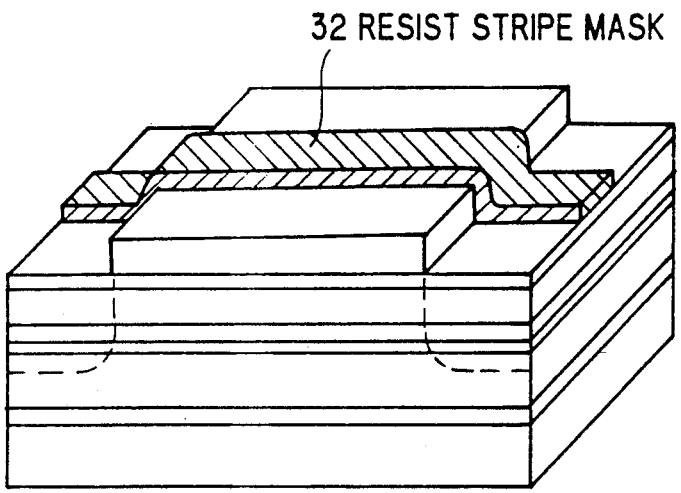
Figure 3C:
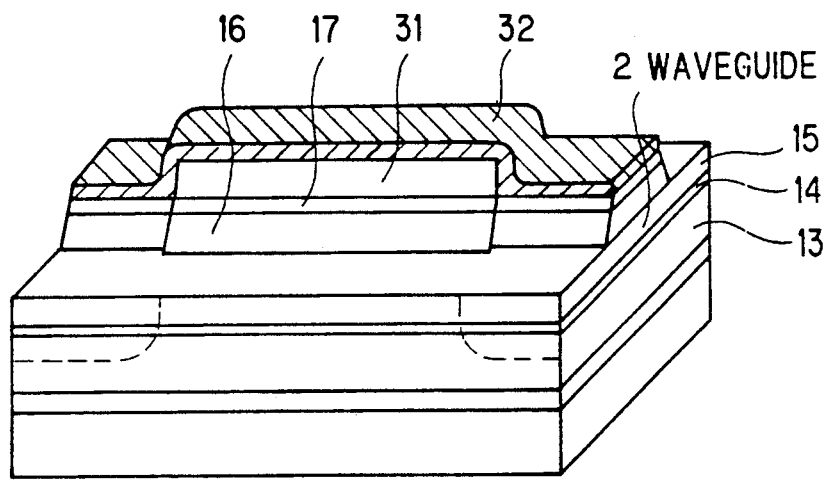

Then, as shown in FIG. 3B, a resist stripe mask 32 is formed on the dielectric 31 and the cap layer 17 by photolithography method, and then some part of the dielectric 31, the cap layer 17, the heterobuffer layer and the outer cladding layer 16 is removed one after another by chemical etching process, as shown in FIG. 3C. As a result, a stripe-shaped waveguide 2 which consists of the outer cladding layer 16, the heterobuffer layer, the inner cladding layer 15, the active layer 14 and the cladding layer 13 is formed by the process described above. The etching-stopping layer provides an accuracy of the etching depth in the chemical etching process.

Figure 3D:
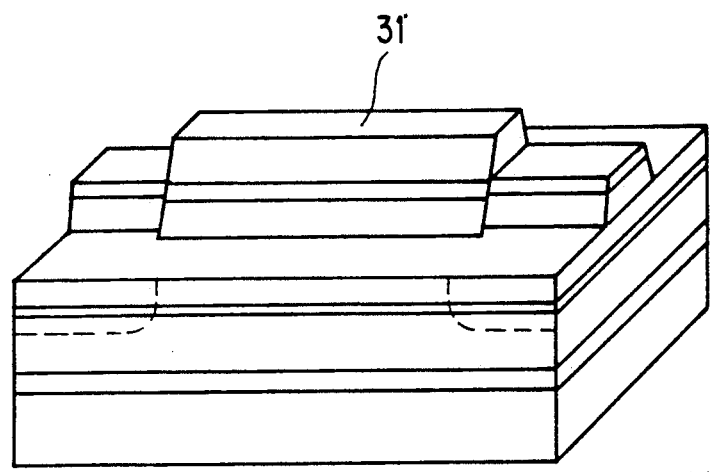

Next, as shown in FIG. 3D, after removing the resist stripe mask 32, an n-type GaAs blocking layer 18 having a thickness of 0.8 μm is selectively formed using the dielectric 31 as a mask. The blocking layer 18 is grown on both sides of the outer cladding layer 16 at an excitation region 3 of the semiconductor laser 1, and on whole region at both impurity diffusion regions 4 and 4 covering a top surface of the cap layer 17. This blocking layer 18 blocks the injection of current into the active layer 14 in the vicinity of the semiconductor laser facet 6, and also the both sides of the outer cladding layer 16 at the excitation region 3. The blocking layer 18 also keeps the laser light within the waveguide 2. Then, the dielectric 31 is removed, and then a p-type GaAs contact layer 19 is formed on the surface of the semiconductor laser 1 which is under fabrication. The blocking layer 18 and the contact layer 19 are formed by MOVPE method. The materials which are used for growing the layers are trimethylgallium (TMG), dimethylzinc (DMZ), and arsine (AsH$_3$). The growth temperature is 660° C., the growth speed is 3.0 μm/hr, and the supplying ratio of V group material/III group material (V/III ratio) is 50.

Finally, a p-electrode and an n-electrode are formed to cover the bottom surface of the substrate 11 and the top surface of the fabricated layers, respectively, and then the semiconductor laser 1 is cleaved in the cross section including the impurity diffusion region 4 to obtain a semiconductor laser facets 6 each having a plane of cleavage.

As described above, the dielectric temporarily formed during the process is used as a mask in a selective diffusion and in a selective growth, so that an alignment of a selective growth mask and an impurity diffusion region is not necessary to carry out. On the other hand, an impurity selective diffusion of Zn into the multi-layer epitaxial layers having GaAs layer or AlGaAs layer as a surface layer is carried out using As compound as an impurity source. In this case, the As compound supplies sufficient As vapor to cover the surface layer of the semiconductor laser and protect thereto, and As which is a V group atom is hard to disconnect from GaAs layer or AlGaAs layer, so that the crystal quality of the surface layer is hard to decrease.

Although the invention has been described with respect to specific embodiment for complete and clear disclosure, the appended claims are not to be so limited and alternative constructions that may occur to one skilled in the art which fairly fall within the basic teaching herein set forth.

What is claimed is:

1. In a semiconductor laser, comprising:
   a semiconductor substrate which has one type of conductivity;
   a first cladding layer formed on said substrate, said first cladding layer having the same type of conductivity as said substrate;
   a super-lattice active layer formed on said first cladding layer;
   a second cladding layer formed on said active layer, said second cladding layer having the opposite type of conductivity as said first cladding layer, and said second cladding layer with said first cladding layer and said active layer forming a double-hetero structure;
   impurity diffusion regions formed in all the layers of the double-hetero structure in the vicinity of both laser facets of said semiconductor laser, said active layer in said impurity diffusion regions having the impurity density of equal to or over $1 \times 10^{17} \text{cm}^{-3}$; and
   a blocking layer formed on said second cladding layer in said impurity diffusion regions, said blocking layer having the same type of conductivity as said first cladding layer.

2. A semiconductor laser, according to claim 1:
   wherein said first cladding layer, said active layer and said second cladding layer are epitaxial layers.

3. A semiconductor laser, according to claim 1:
   wherein said active layer is a natural super-lattice active layer.

4. A semiconductor laser, according to claim 1:
   wherein said active layer is a layer selected from a GaInP layer and a AlGaInP layer.

* * * * *

UNITED STATES PATENT AND TRADEMARK OFFICE
CERTIFICATE OF CORRECTION

PATENT NO. : 5,151,913
DATED : September 29, 1992
INVENTOR(S) : Yoshiyasu Ueno

It is certified that error appears in the above-indentified patent and that said Letters Patent is hereby corrected as shown below:

Col. 2, line 29, delete ",;" and insert --;--.

Col. 4, line 20, delete "0.4" and insert --o--;

line 22, after "formed." --The-- should begin a new paragraph.

Signed and Sealed this

Eighth Day of February, 1994

Attest:

BRUCE LEHMAN

Attesting Officer     Commissioner of Patents and Trademarks